(12) United States Patent
Hsieh et al.

(10) Patent No.: US 7,390,729 B2
(45) Date of Patent: Jun. 24, 2008

(54) METHOD OF FABRICATING A SEMICONDUCTOR DEVICE

(75) Inventors: Chao-Ching Hsieh, Hsinchu County (TW); Chun-Chieh Chang, Tainan County (TW); Tzung-Yu Hung, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/309,740

(22) Filed: Sep. 21, 2006

(65) Prior Publication Data

US 2008/0076213 A1   Mar. 27, 2008

(51) Int. Cl.
*H01L 21/44* (2006.01)

(52) U.S. Cl. .................. 438/583; 438/664; 438/682; 438/E29.126

(58) Field of Classification Search ......... 438/586–582, 438/653, 664, 682, 592–595
See application file for complete search history.

(56) References Cited

U.S. PATENT DOCUMENTS 4,877,755 A * 10/1989 Rodder ................ 438/586

* cited by examiner

*Primary Examiner*—Dung A. Le
(74) *Attorney, Agent, or Firm*—Jianq Chyun IP Office (57) ABSTRACT

A method of fabricating semiconductor device is provided. A transistor is formed on a substrate, and a metal silicide layer is formed on the surface of a gate conductor layer and a source/drain region. Next, a surface treatment process is performed to selectively form a protection layer on the surface of the metal silicide layer. Then, a spacer of the transistor is partially removed using the protection layer as a mask, so as to reduce the width of the spacer. Then, a stress layer is formed on the substrate.

18 Claims, 5 Drawing Sheets

METHOD OF FABRICATING A SEMICONDUCTOR DEVICE

BACKGROUND OF THE INVENTION

1. Field of Invention

The present invention relates to an integrated circuit and a method of fabricating the same. More particularly, the present invention relates to a semiconductor device and a method of fabricating the same.

2. Description of Related Art

In common semiconductor processes, after a metal oxide semiconductor (MOS) transistor is fabricated, a stress layer will be formed on the substrate to increase the mobility of electrons or holes in the channel of the MOS transistor. In semiconductor processes with a line width lower than 65 nm, for a p-type MOS transistor, a stress layer having compressive stress can be formed on the substrate, so as to generate the compressive stress along the channel direction in the p-type MOS transistor; and for an n-type MOS transistor, a stress layer having tensile stress can be formed on the substrate, so as to generate the tensile stress along the channel direction of the n-type transistor. With the increase of the compressive stress or the tensile stress, the mobility of holes or electrons in the channel is also increased, so as to increase the drive current, and further improve the performance of the device.

However, with the development of semiconductor technology, the requirements on the performance of semiconductor devices are gradually becoming higher and higher. Therefore, it is an important and urgent task to further increase the compressive stress or the tensile stress along the channel direction in the MOS transistor, so as to improve the mobility of electrons or holes in the channel.

Figure 6A:
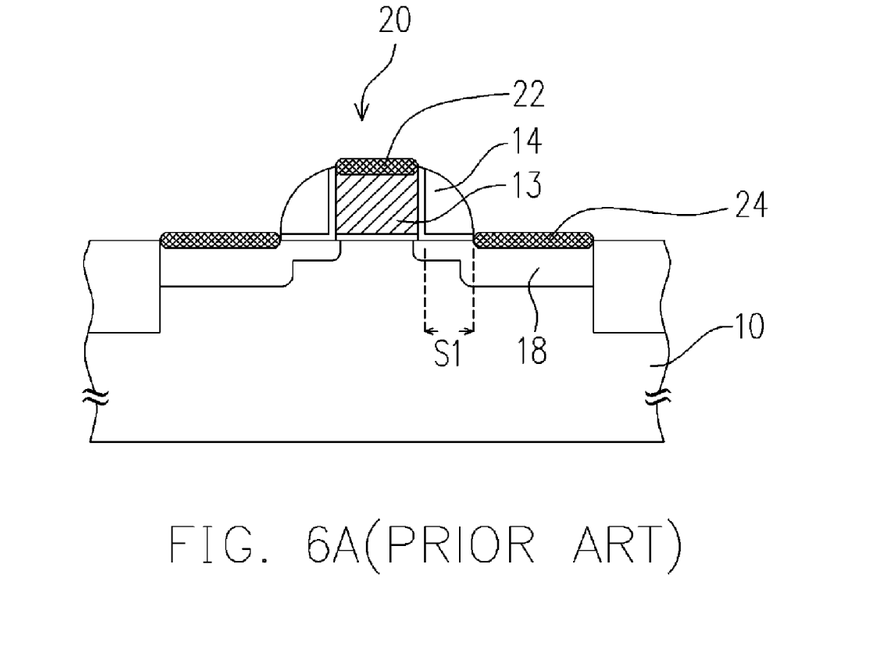
FIGS. 6A~6B are sectional flow charts of a method of fabricating a semiconductor device to improve the mobility of electrons or holes in the channel according to prior art.
Figure 6B:
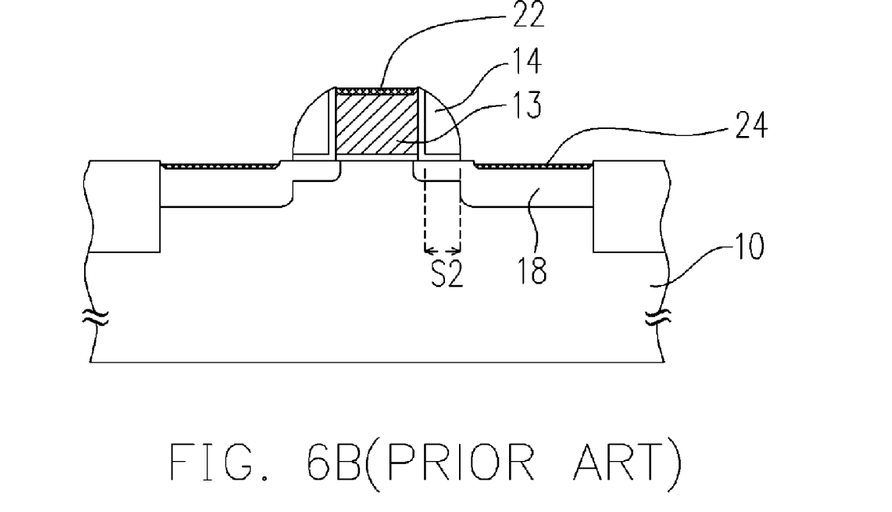

FIGS. 6A~6B are sectional flow charts of a method of fabricating a semiconductor device to improve the mobility of electrons or holes in the channel according to prior art.

Referring to FIG. 6A, a MOS transistor 20 is formed on a substrate 10, and metal silicide layers 22 and 24 are formed on the gate structure 13 and source/drain region 18, respectively. Referring to FIG. 6B, to enable the stress layer formed subsequently to have better stress performance, normally an etching process is performed before the stress layer is formed, so as to reduce the width S1 of the spacer 14 to S2, which allows the stress layer formed subsequently to be closer to the channel, thus the mobility of electrons or holes in the channel is increased. However, when the etching process is performed, the metal silicide layers 22 and 24 are directly exposed to the etching environment without any protection, the metal silicide layers 22 and 24 will be damaged after the etching process, especially after the over etching, resulting in unsatisfactory sheet resistance.

SUMMARY OF THE INVENTION

The present invention is to provide a semiconductor device and a method of fabricating the same, which improve the mobility of electrons or holes in the channel and prevent the metal silicide layers from being damaged during the subsequent etching process of reducing the width of the spacer.

The present invention provides a method of fabricating a semiconductor device. First, a transistor is formed on a substrate. The transistor comprises a gate structure and a source/drain region, wherein the gate structure comprises a gate conductor layer over the substrate, a gate dielectric layer between the gate conductor layer and the substrate and a spacer on the side wall of the gate conductor layer. Then, a metal silicide layer is formed on the surface of the gate conductor layer and the source/drain region of the transistor. After that, a surface treatment process is performed to selectively form a protection layer on the metal silicide layer, and the material of the protection layer is different from that of the spacer on the side wall of the gate conductor layer. Next, using the protection layer as a mask, the spacer is partially removed, so as to reduce the width of the spacer, such that a space exists between the spacer and the metal silicide layer. Then, a stress layer is formed on the substrate and covers the spacer, the protection layer and the space between the spacer and the metal silicide layer.

According to an embodiment of the present invention, the step of forming the metal silicide layer on the surface of the gate conductor layer and the source/drain region comprises forming a metal layer on the substrate; next, performing a first annealing process to enable the metal layer to react with the surface of the gate conductor layer and the surface of the source/drain region, so as to form the metal silicide layer; and then selectively removing the metal layer that is not reacted and performing a second annealing process.

According to an embodiment of the present invention, the surface treatment step is performed between the step of selectively removing the metal layer that is not reacted and the step of the second annealing, or is performed after the step of the second annealing and before the step of partially removing the spacer.

According to an embodiment of the present invention, the surface treatment step includes an oxidization process a nitridation process or an oxynitridation process. The oxidization process can be a wet oxidization process or a dry oxidization process. The wet oxidization process may use hydrogen peroxide water solution, ozone water solution or acidic solution as an oxidizer. The dry oxidization process can be an oxygen ashing or a plasma oxidization process. In the plasma oxidization process, oxygen, ozone, nitrous oxide, nitrogen monoxide or the combinations thereof can be introduced to function as a reacting gas.

According to an embodiment of the present invention, the surface treatment step includes a nitridation process. The nitridation process includes the plasma nitridation process, which, for example, introduces nitrogen and hydrogen or ammonia as the reacting gas.

According to an embodiment of the present invention, the metal silicide can be silicides of titanium, cobalt, nickel, platinum, palladium, molybdenum, or alloys or combinations thereof.

The present invention provides a semiconductor device, which comprises a transistor, a metal silicide layer, a protection layer and a stress layer. The transistor disposed on the substrate comprises a gate structure and a source/drain region, wherein the gate structure comprises a gate conductor layer, a gate dielectric layer and a spacer. The gate dielectric layer is disposed between the gate conductor layer and the substrate, and the spacer is disposed on the side wall of the gate conductor layer. The metal silicide layer is located on the surface of the source/drain region and the surface of the gate conductor layer, and a space exists between the metal silicide layer above the source/drain region and the spacer. The protection layer covers the metal silicide layer, but does not cover the spacer. The stress layer covers the spacer, the protection layer, and the space.

According to an embodiment of the present invention, the protection layer includes metal oxides, metal nitrides or metal oxynitrides.

According to an embodiment of the present invention, the metal silicide can be silicides of titanium, cobalt, nickel, platinum, palladium, molybdenum, or alloys or combinations thereof.

According to an embodiment of the present invention, the stress layer is a compressive stress layer or a tensile stress layer.

In the present invention, a surface treatment step is performed before the step of reducing the width of the spacer to form a protection layer on the metal silicide layers via surface reaction, thus preventing the metal silicide layers from being damaged during the subsequent etching process of reducing the width of the spacer.

In order to make the aforementioned and other objectives, features and advantages of the present invention comprehensible, preferred embodiments accompanied with figures are described in detail below.

DESCRIPTION OF EMBODIMENTS

FIGS. 1A~1D are sectional flow charts of a method of fabricating a semiconductor device according to an embodiment of the present invention.

Figure 1A:
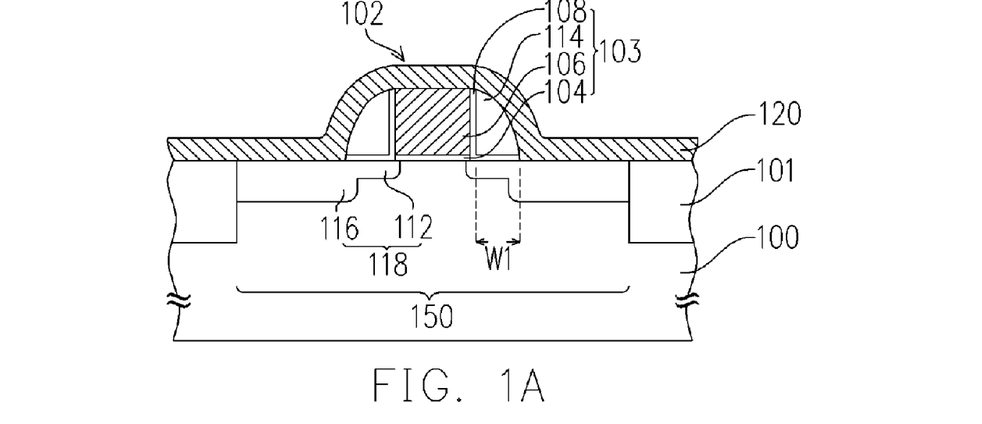
FIGS. 1A~1D are sectional flow charts of a method of fabricating a semiconductor device according to an embodiment of the present invention.

Referring to FIG. 1A, an isolation structure 101 is formed in a substrate 100 to define an active area 150. Then, a transistor 102 is formed in the active area 150. The transistor 102 includes a gate structure 103 and a source/drain region 118.

The substrate 100 is, for example, a substrate of bulk semiconductor, or a silicon-on-insulator (SOI) substrate, such as a substrate containing silicon, epitaxial silicon, germanium, silicon germanium silicon carbide, or the combinations thereof.

Figure 2:
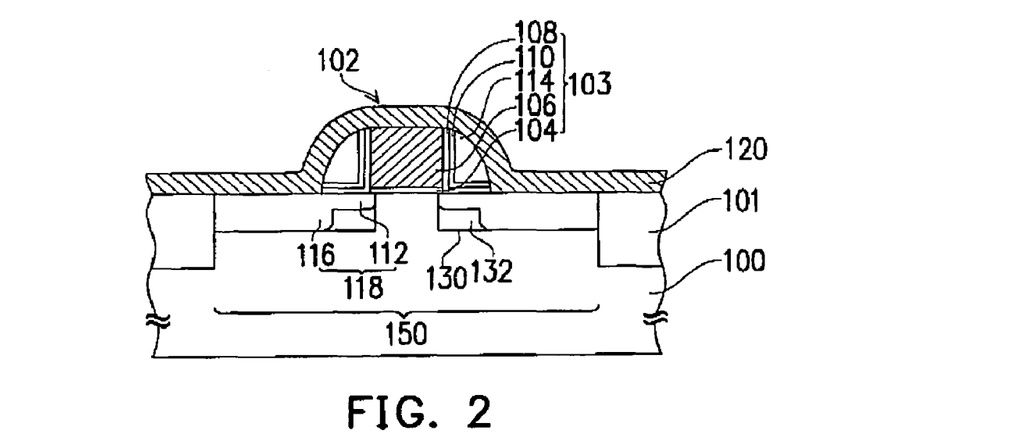
FIG. 2 is a partial sectional view of a method of fabricating a semiconductor device according to another embodiment of the present invention.

The method of forming the transistor 102 is, for example, first forming a patterned gate dielectric layer 104 and a gate conductor layer 106 on the substrate 100. The gate dielectric layer 104 is, for example, a silicon oxide layer, silicon oxynitride layer, silicon nitride layer or high dielectric constant material layer with a dielectric constant higher than the silicon oxide, such as an $HfSi_xO_y$ layer, an $HfSi_xN_yO_z$ layer, a $ZrO_2$ layer, an $HfO_2$ layer, a $TiO_2$ layer, an $La_2O_3$ layer, a $Ta_2O_5$ layer, a $CeO_2$ layer, a $Y_2O_3$ layer, or an $Al_2O_3$ layer, which can be formed by a thermal oxidization process or deposition process. The material of the gate conductor layer 106 is, for example, polysilicon, and the method of forming the gate conductor layer 106 is, for example, chemical vapor deposition. Then, a lightly doped source/drain region 112 or a source/drain extension region 112 of the source/drain region 118 is formed in the substrate 100. In the present embodiment, the illustration is based on the lightly doped source/drain region 112. Then, a spacer 114 is formed on the side wall of the gate conductor layer 106. Then, a heavily doped source/drain region 116, or a source/drain contact region 116 of the source/drain region 118 is formed in the substrate 100. In the present embodiment, the illustration is based on the heavily doped source/drain region 116. The material of the spacer 114 is, for example, silicon oxide or silicon nitride. Before the spacer 114 is formed, a liner layer 108 (as shown in FIG. 1A) or two liner layers 108 and 110 can be formed on the side wall of the gate conductor layer 106. Referring to FIG. 1A, in an embodiment, when the material of the spacer 114 is silicon oxide, the material of the liner layer 108 can be silicon oxide. Referring to FIG. 2, in another embodiment, when the material of the spacer 114 is silicon oxide, the materials of the liner layers 108 and 110 can be silicon oxide and silicon nitride respectively. Typically, one or two offset spacers (not shown) can be formed on the side wall of the gate conductor layer 106 before the liner layer 108 is formed according to the process requirements. In the present embodiment, the fabricating process of the semiconductor device of the present invention is illustrated with reference to FIG. 1A.

The dopant of the source/drain region 118 is, for example, an n-type dopant or a p-type dopant. For example, the n-type dopant uses phosphor or arsenic, and the p-type dopant uses boron. Referring to FIG. 1A, in one embodiment, the method of forming the source/drain region 118 is ion implantation, and the lightly doped source/drain region 112 and the heavily doped source/drain region 116 are formed by directly implanting the dopant into the substrate 100. Referring to FIG. 2, in another embodiment, the method of forming the source/drain region 118 comprises: after forming the gate conductor layer 106, etching and removing the areas on both sides of the gate conductor layer 106 where the source/drain region 118 is to be formed, so as to form recesses 130; next, refilling the recesses 130 with material layers 132 of a material other than the substrate 100; and then performing the ion implantation process to form the lightly doped source/drain region 112 and the heavily doped source/drain region 116. The method of refilling the material layers 132 can be the chemical vapor deposition or epitaxy process. In the example of the p-type MOS transistor, the refilled material layers 132 are, for example, silicon germanium and in the example of the n-type MOS transistor, the refilled material layers 132 are, for example, silicon carbide.

After that, a metal layer 120 is formed on the substrate 100, wherein the material of the metal layer 120 is, for example, titanium, cobalt, nickel, platinum, palladium, molybdenum, or alloys or combinations thereof.

Figure 1B:
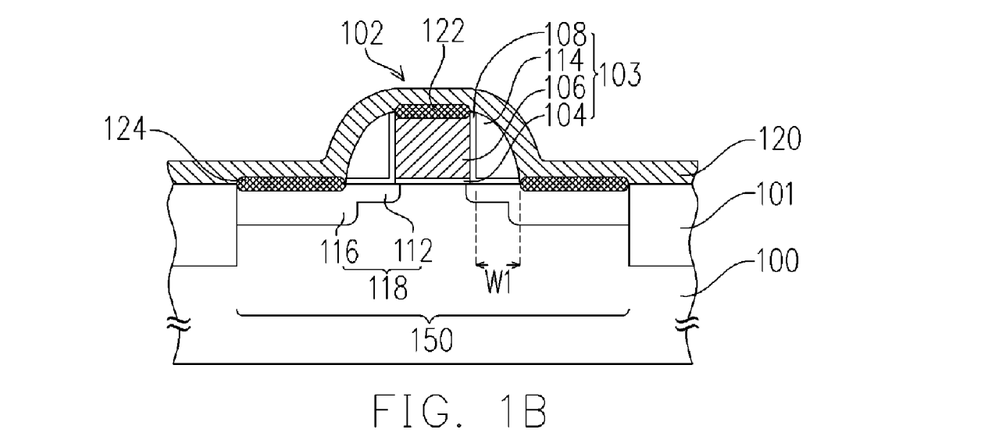

Referring to FIG. 1B, a annealing process is performed, such that the metal layer 120 reacts with the silicon on the surface of the gate conductor layer 106 and the surface of the source/drain region 118, so as to form metal silicide layers 122 and 124 on the gate conductor layer 106 and the source/drain region 118 respectively. The annealing process can be a rapid thermal process (RTP). The temperature and time of the annealing are related to the characteristics of the material of the metal layer 120.

Figure 1C:
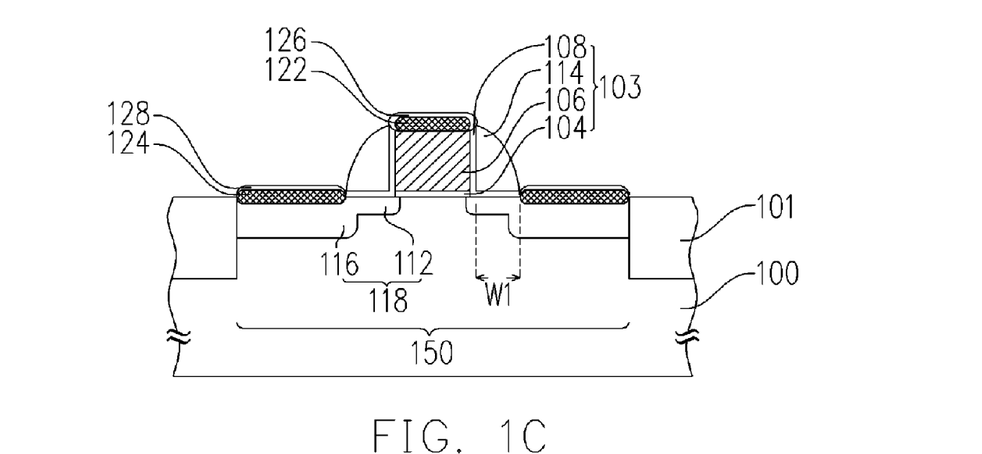

Referring to FIG. 1C, the metal layer 120 that is not reacted is selectively removed, such that the metal silicide layers 122 and 124 on the gate conductor layer 106 and the source/drain region 118 are exposed. The method of selectively removing the metal layer that is not reacted can be a wet etching method, for example, with sulfuric acid hydrogen peroxide mixture (SPM), ammonia hydrogen peroxide mixture (APM) or hydrochloric peroxide mixture (HPM) functioning as an etchant.

Then, the second annealing can be performed according to different materials of the formed metal silicide layers 122 and 124, so as to make the metal silicide layers 122 and 124 have better properties, such as lower resistance or better thermal stability. The second annealing process can be a rapid thermal process. The temperature and time of the annealing are related to the characteristics of the material of the metal layer 120.

Referring to FIG. 1C, to enable the stress layer formed subsequently to have better stress performance, normally an etching process is performed before the stress layer is formed, so as to reduce the width W1 of the spacer 114, which allows the stress layer formed subsequently to be closer to the channel, thus the mobility of electrons or holes in the channel is increased. However, when the etching process is performed, if the metal silicide layers 122 and 124 are directly exposed to the etching environment without any protection, the metal silicide layers 122 and 124 will be damaged after the etching process, especially after the over etching, resulting in unsatisfactory sheet resistance. Before the step of reducing the width W1 of the spacer 114, in the present invention, a surface treatment step can be performed first, so as to form protection layers 126, 128 on the metal silicide layers 122, 124 respectively via surface reaction, and protect the metal silicide layers 122 and 124 from being damaged in the subsequent processes.

The surface treatment step can be an oxidization step, a nitridation step or an oxynitridation step, so as to form the protection layers 126, 128 by oxidizing, nitriding, or oxynitriding the surfaces of the metal silicide layers 122 and 124 respectively. To enable the protection layers 126, 128 formed in the surface treatment step to have better protective effect, the material of the protection layers 126, 128 is preferably different from that of the spacer 114, so as to provide better selectivity during the subsequent etching process for reducing the width of the spacer 114. In one embodiment, the material of the spacer 114 is silicon nitride, and the surface treatment step can be an oxidization step, which oxidizes the surfaces of the metal silicide layers 122 and 124 to form the metal oxide protection layers 126, 128. The oxidization step can be a wet oxidization process or a dry oxidization process. The wet oxidization process may use the hydrogen peroxide water solution, ozone water solution or acidic solution such as nitric acid or sulfuric acid as an oxidizer. The dry oxidization process can be an oxygen ashing or a plasma oxidization process. In the plasma oxidization process, for example, oxygen, ozone, nitrous oxide, nitrogen monoxide or the combinations thereof can be introduced to function as a reacting gas. In another embodiment, the material of the spacer 114 is silicon oxide, and the surface treatment step can be a nitridation step, which nitrides the surfaces of the metal silicide layers 122 and 124 to form the metal nitride protection layers 126, 128. The nitridation step can be a dry nitridation process. The dry nitridation process can be a plasma nitridation process. In the plasma nitridation process, for example, nitrogen and hydrogen or ammonia are introduced to serve as a reacting gas. In another embodiment, the material of the spacer 114 is silicon oxide, and the surface treatment step can be an oxynitridation step, which oxynitrides the surfaces of the metal silicide layers 122 and 124 to form the metal oxynitride protection layers 126, 128. The oxynitridation step can be a dry oxynitridation process. The dry oxynitridation process can be an oxynitridation reaction in a plasma environment containing nitrogen and oxygen such as nitrous oxide or nitrogen monoxide serving as a reacting gas.

Figure 1D:
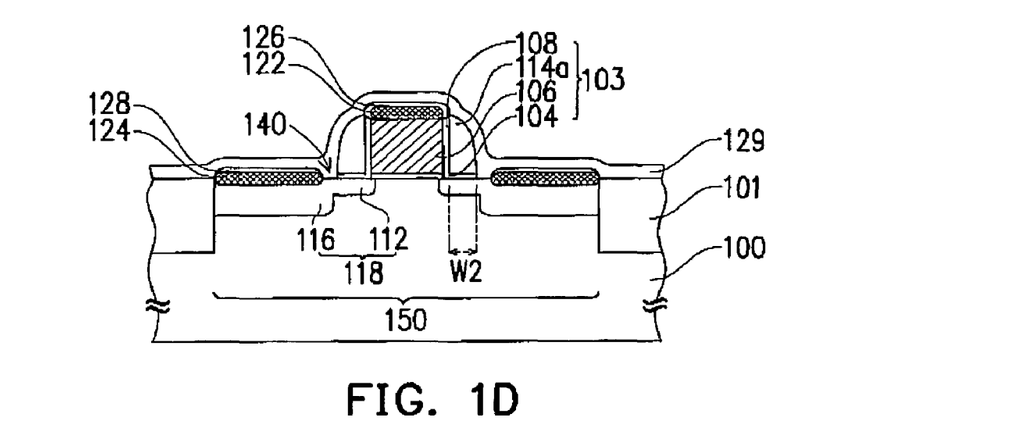

Referring to FIG. 1D, an etching process is performed after the protection layers 126, 128 are formed, so as to reduce the width W1 of the spacer 114, such that a space 140 exists between the remained spacer 114a with a width W2 and the metal silicide layer. During the etching, the protection layers 126, 128 function as a mask to protect the silicide layers 122, 124 from being damaged. Therefore, in the present invention, the extra width of the spacer 114 can be removed by etching, such that the stress layer formed subsequently is closer to the channel. The etching process for reducing the width of the spacer 114 can be a wet etching process, a dry etching process or a vapor etching process. In one embodiment, when the spacer 114 is silicon nitride, in the wet etching process, hot phosphoric acid can be used as the etchant. In the dry etching process, the temperature of the substrate 100 is maintained to be higher than that of the introduced etching gas, and the etching is performed with hydrogen fluoride-containing gas and vapor predetermined oxidizing agents such as nitric acid, ozone, hydrogen peroxide, hypochlorous acid, chloric acid, oxygen, sulfuric acid or chlorobromide as the etching gas. In the vapor etching process, the temperature of the substrate 100 is maintained at 125° C., and anhydrous hydrogen fluoride is introduced to function as an etching gas to perform etching. In another embodiment, when the spacer 114 is silicon oxide, the hydrofluoric acid can be used as an etchant in the wet etching process, the plasma of fluorine-containing gases such as $CF_4$ can be used in the dry etching process, and the hydrofluoric acid steam can be used in the vapor etching process.

And then, a stress layer 129 is formed on the substrate 100, so as to cover the spacer 114a, the protection layers 126, 128, and the space 140. In the example of the p-type MOS transistor, the stress layer 129 is a compressive stress layer, which forms the compressive stress along the channel direction in the p-type MOS transistor to improve the mobility of carriers. In the example of the n-type MOS transistor, the stress layer 129 is a tensile stress layer, which forms the tensile stress along the channel direction in the n-type MOS transistor to improve the mobility of carriers. As the width of the spacer 114 is reduced, the remained spacer 114a is narrower, and the space 140 is formed between the spacer 114a and the metal silicide layer 124. Therefore, the stress layer 129 is closer to the channel, and has better stress performance.

Referring to FIG. 3 and FIGS. 1A~1D, the metal silicide layers 122 and 124 can be protected by only performing the surface treatment step 312 of the present invention before the step of reducing the width of the spacer 114. In other words, the time to perform the surface treatment step 312 is after Step 302 of forming the transistor 102 on the substrate 100 and Step 310 of forming the metal silicide layers 122 and 124 on the source/drain region 118, and is before Step 314 of reducing the width W1 of the spacer 114 and Step 316 of forming the stress layer 129.

Figure 3:
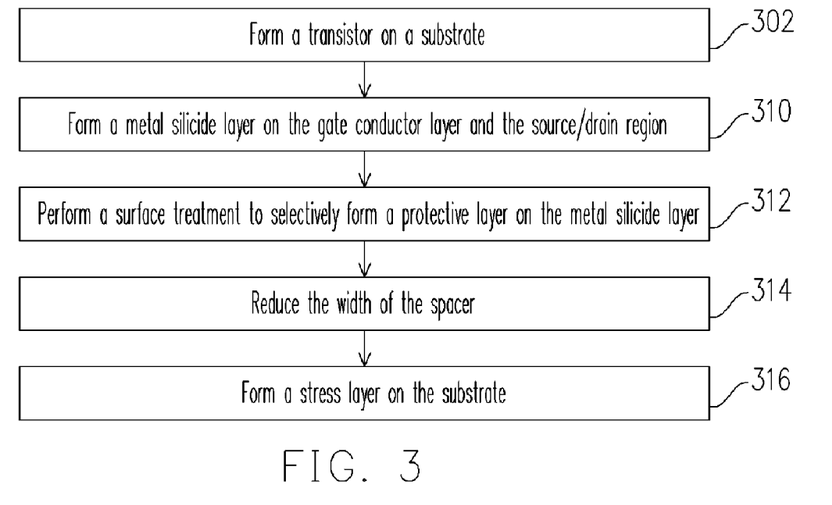
FIG. 3 is a flow chart of a method of fabricating a semiconductor device according to an embodiment of the present invention.
Figure 4:
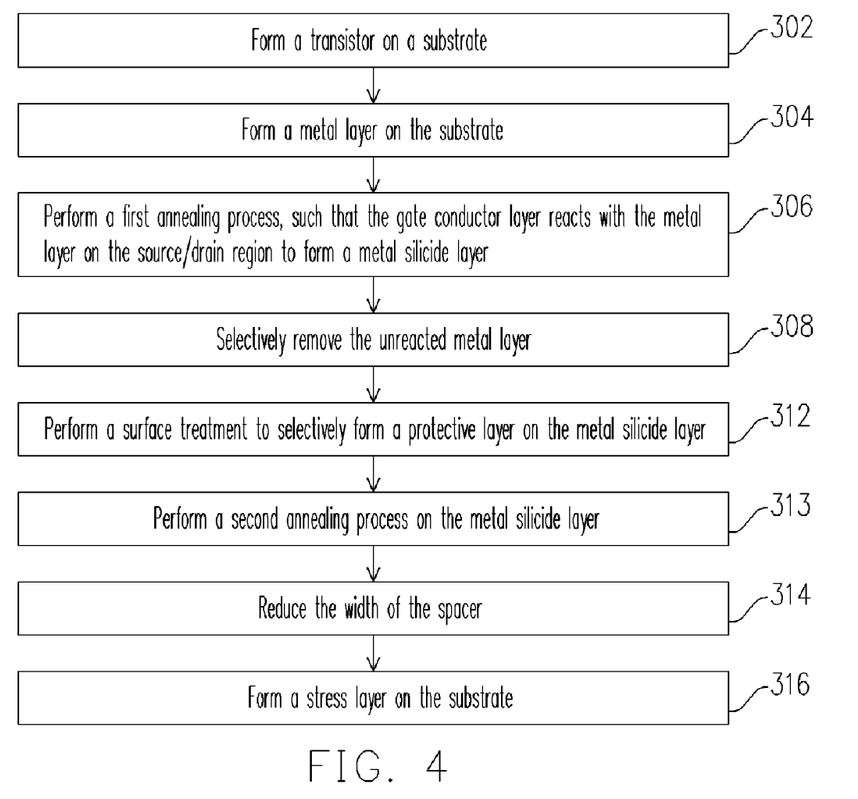
FIG. 4 is a flow chart of a method of fabricating a semiconductor device according to another embodiment of the present invention.
Figure 5:
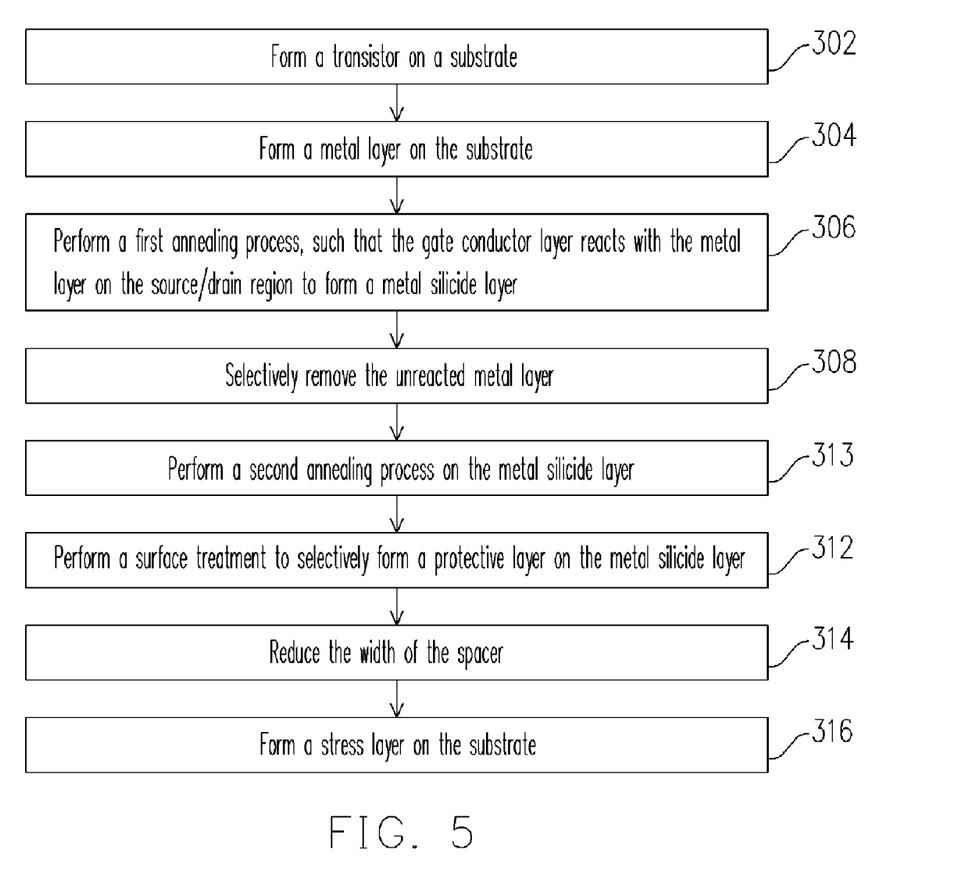
FIG. 5 is a flow chart of a method of fabricating a semiconductor device according to still another embodiment of the present invention.

In particular, the surface treatment step 312 may be performed before the second annealing step, or after the second annealing step.

Referring to FIG. 4 and FIGS. 1A~1D, in one embodiment, the surface treatment step 312 is performed before the second annealing step. More particularly, Step 302 is performed first to form the transistor 102 on the substrate 100. Then, Step 304 is performed to form the metal layer 120 on the substrate 100. After that, Step 306 of the first annealing is performed to form the metal silicide layers 122 and 124. Next, Step 308 is performed to selectively remove the metal layer 120 that is not reacted. Then, Step 312 is performed to process the surface treatment on the metal silicide layers 122 and 124. After the surface treatment to the metal silicide layers 122 and 124, Step 313 is performed to process the second annealing on the metal silicide layers 122 and 124. Next, Step 314 is performed to reduce the width W1 of the spacer 114. And then, Step 316 is performed to form the stress layer 129. In Step 312, the method of surface treatment can be a wet process or a dry process. As the method of selectively removing the metal layer 120 that is not reacted is normally the selective wet etching, if the surface treatment also adopts the wet process, it can be performed in-situ concurrently, and the process is convenient and rapid.

Referring to FIG. 5 and FIGS. 1A~1D, in another embodiment, the surface treatment step 312 is performed after the second annealing step. More particularly, Step 302 is performed first to form the transistor 102 on the substrate 100. Then, Step 304 is performed to form the metal layer 120 on the substrate 100. Next, Step 306 of the first annealing is performed to form the metal silicide layers 122 and 124. After that, Step 308 is performed to remove the metal layer 120 that is not reacted. Then, Step 313 is performed to process the second annealing on the metal silicide layers 122 and 124. Next, Step 312 is performed to process the surface treatment on the metal silicide layers 122 and 124. Afterward, Step 314 is performed to reduce the width W1 of the spacer 114. And then, Step 316 is performed to form the stress layer 129.

In the method of fabricating a semiconductor device of the present invention, as a step of reducing the width of the spacer is performed prior to the step of forming the stress layer, the distance between the stress layer and the channel is shorter, and the compressive stress or the tensile stress along the channel direction is increased, therefore the mobility of electrons or holes in the channel is improved effectively. Moreover, a surface treatment step is performed before the step of reducing the width of the spacer to form a protection layer on the metal silicide layers via surface reaction, thus preventing the metal silicide layers from being damaged during the subsequent etching process of reducing the width of the spacer.

What is claimed is:

1. A method of fabricating a semiconductor device, comprising:
    forming a transistor having a gate structure and a source/drain region on a substrate, wherein the gate structure comprises a gate conductor layer, a gate dielectric layer and a spacer, the gate dielectric layer is disposed between the gate conductor layer and the substrate, and the spacer is disposed on the side wall of the gate conductor layer;
    forming a metal layer on the substrate;
    performing a first annealing step, such that the metal layer reacts with the surface of the gate conductor layer and the surface of the source/drain region to form a metal silicide layer on the surface of the gate conductor layer and the surface of the source/drain region;
    selectively removing the metal layer that is not reacted;
    performing a second annealing step;
    performing a surface treatment step between the step of selectively removing the metal layer that is not reacted and the second annealing step to selectively form a protection layer on the metal silicide layer, wherein the material of the protection layer is different from that of the spacer;
    using the protection layer as a mask, partially removing the spacer so as to reduce a width of the spacer, such that a space exists between the spacer and the metal silicide layer; and
    forming a stress layer on the substrate, so as to cover the spacer, the protection layer and the space.

2. The method of fabricating a semiconductor device as claimed in claim 1, wherein the surface treatment step comprises an oxidization process, a nitridation process or an oxynitridation process.

3. The method of fabricating a semiconductor device as claimed in claim 2, wherein the oxidization process is a wet oxidization process or a dry oxidization process.

4. The method of fabricating a semiconductor device as claimed in claim 3 wherein the wet oxidization process uses hydrogen peroxide water solution, ozone water solution, or acidic solution as an oxidizer.

5. The method of fabricating a semiconductor device as claimed in claim 3, wherein the dry oxidization process is an oxygen ashing process or a plasma oxidization process.

6. The method of fabricating a semiconductor device as claimed in claim 5, wherein the plasma oxidization process uses introduced oxygen, ozone, nitrous oxide, nitrogen monoxide or the combinations thereof as a reacting gas.

7. The method of fabricating a semiconductor device as claimed in claim 2, wherein the nitridation process comprises a plasma nitridation process.

8. The method of fabricating a semiconductor device as claimed in claim 7, wherein the plasma nitridation process uses introduced nitrogen and hydrogen, or ammonia as a reacting gas.

9. The method of fabricating a semiconductor device as claimed in claim 1, wherein the metal silicide is a silicide of titanium, cobalt, nickel, platinum, palladium, molybdenum, or alloys or combinations thereof.

10. A method of fabricating a semiconductor device, comprising:
    forming a transistor having a gate structure and a source/drain region on a substrate, wherein the gate structure comprises a gate conductor layer, a gate dielectric layer and a spacer, the gate dielectric layer is disposed between the gate conductor layer and the substrate, and the spacer is disposed on the side wall of the gate conductor layer;
    forming a metal layer on the substrate;
    performing a first annealing step, such that the metal layer reacts with the surface of the gate conductor layer and the surface of the source/drain region to form a metal silicide layer on the surface of the gate conductor layer and the surface of the source/drain region;
    selectively removing the metal layer that is not reacted;
    performing a second annealing step;
    performing a surface treatment step after the second annealing step to selectively form a protection layer on the metal silicide layer, wherein the material of the protection layer is different from that of the spacer; and
    using the protection layer as a mask, partially removing the spacer after performing the surface treatment step so as to reduce a width of the spacer, such that a space exists between the spacer and the metal silicide layer;
    forming a stress layer on the substrate, so as to cover the spacer, the protection layer and the space.

11. The method of fabricating a semiconductor device as claimed in claim 10, wherein the surface treatment step comprises an oxidization process, a nitridation process or an oxynitridation process.

12. The method of fabricating a semiconductor device as claimed in claim 11, wherein the oxidization process is a wet oxidization process or a dry oxidization process.

13. The method of fabricating a semiconductor device as claimed in claim 12, wherein the wet oxidization process uses hydrogen peroxide water solution, ozone water solution, or acidic solution as an oxidizer.

14. The method of fabricating a semiconductor device as claimed in claim 12, wherein the dry oxidization process is an oxygen ashing process or a plasma oxidization process.

15. The method of fabricating a semiconductor device as claimed in claim 14 wherein the plasma oxidization process uses introduced oxygen, ozone, nitrous oxide, nitrogen monoxide or the combinations thereof as a reacting gas.

16. The method of fabricating a semiconductor device as claimed in claim 11, wherein the nitridation process comprises a plasma nitridation process.

17. The method of fabricating a semiconductor device as claimed in claim 16, wherein the plasma nitridation process uses introduced nitrogen and hydrogen, or ammonia as a reacting gas.

18. The method of fabricating a semiconductor device as claimed in claim 11 wherein the metal silicide is a silicide of titanium, cobalt, nickel, platinum, palladium, molybdenum, or alloys or combinations thereof.

* * * * *